(12) United States Patent
Ju et al.

(10) Patent No.: US 6,284,594 B1
(45) Date of Patent: Sep. 4, 2001

(54) FORMATION OF AN INTERPOLY CAPACITOR STRUCTURE USING A CHEMICAL MECHANICAL POLISHING PROCEDURE

(75) Inventors: Yong Ju; Kai Shao; Yimin Wang; Shao-Fu Sanford Chu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/580,607

(22) Filed: May 30, 2000

(51) Int. Cl.[7] .................................................. H01L 21/8242
(52) U.S. Cl. ........................ 438/250; 438/393; 438/394
(58) Field of Search ..................................... 438/239, 240, 438/242, 250, 251, 381, 393, 394

(56) References Cited

U.S. PATENT DOCUMENTS

| 5,607,873 | 3/1997 | Chen et al. | |
|---|---|---|---|
| 5,804,488 | 9/1998 | Shih et al. | 438/396 |
| 5,866,451 | 2/1999 | Yoo et al. | 438/241 |
| 5,891,763 | 4/1999 | Wamlass | 438/149 |
| 5,924,011 | 7/1999 | Huang | 438/655 |
| 6,184,927 | * | 2/2001 | Kang | 438/240 |

* cited by examiner

Primary Examiner—David Nelms
Assistant Examiner—Dung A Le
(74) Attorney, Agent, or Firm—George O. Saile; Rosemary L. S. Pike

(57) ABSTRACT

A process for simultaneously forming a polysilicon gate structure, for a transfer gate transistor, and a polysilicon top plate, for a capacitor structure, on an underlying planar surface, has been developed. The process features the formation of a polysilicon bottom plate, for the capacitor structure, embedded in a first opening in composite insulator layer, and the formation of an active device region, for a transfer gate transistor structure, via the selective growth of an epitaxial silicon layer, in a second opening of the composite insulator layer, resulting in a planar top surface topography. The presence of this topography reduces the risk of residual polysilicon, present after patterning of the polysilicon gate structure, and of the capacitor, polysilicon top plate.

24 Claims, 4 Drawing Sheets

FORMATION OF AN INTERPOLY CAPACITOR STRUCTURE USING A CHEMICAL MECHANICAL POLISHING PROCEDURE

BACKGROUND OF THE INVENTION (1) Field of the Invention

The present invention relates to methods used to fabricate semiconductor devices, and more specifically to a process for integrating the processes needed to fabricate a capacitor structure, and a transfer gate transistor, on the same semiconductor chip (2) Description of Prior Art To reduce processing costs of memory and logic semiconductor devices, comprised with both polysilicon capacitor structures, and transfer gate transistor, polysilicon gate structures, integration of as many process steps, or process sequences, used for both the capacitor and transfer gate transistor is desirable. However although some process sequences allow the desired process integration, deleterious effects, due to the sharing of process steps and sequences can occur. For example if the capacitor bottom plate, and gate structure, of the transfer gate transistor, are formed during the same process sequence, in addition to the formation of source/drain regions, formed self-aligned to the polysilicon gate structure of the transfer gate transistor, the temperature needed for formation of a capacitor dielectric layer, on the surface of the polysilicon bottom plate, of the capacitor, can result in unwanted movement of dopants in the transfer gate transistor region. If the polysilicon gate structure is formed after formation of the polysilicon bottom plate, the topography created by the bottom plate structure may result in difficulties when patterning the polysilicon gate structure, using anisotropic reactive ion etching procedures, resulting in unremoved polysilicon ribbons and residues, possibly resulting in a conductive path allowing leakage or shorts, between specific devices to occur.

This invention will describe a novel process sequence allowing integration of many process steps, and sequences, used for both the capacitor structure and a transfer gate transistor, to be shared. Featured in this invention is the creation of a polysilicon bottom plate, embedded in insulator, formed by a chemical mechanical polishing, (CMP), procedure, prior to formation of a polysilicon gate structure, of a transfer gate transistor. Also featured in this invention is the formation of the well regions, and the source/drain regions, in a epitaxial silicon layer, selectively grown on the semiconductor substrate, in an opening in the same insulator layers that the capacitor bottom plate resides on. This allows, after the growth of a gate insulator layer, on the epitaxial silicon layer, in the transfer gate transistor region, as well as the formation of an capacitor dielectric layer, on the capacitor bottom plate, the simultaneous formation of a polysilicon gate structure, on the gate insulator layer, and of a upper polysilicon plate structure, on the capacitor dielectric layer. Prior art, such as Huang, in U.S. Pat. No. 5,924,011, as well as Chen et al, in U.S. Pat. No. 5,607,873, describe processes for forming a capacitor structure, over a field oxide region, however these prior arts do not describe the key features of this present invention, which include: a polysilicon bottom plate, embedded in an insulator layer, via a CMP procedure; the simultaneous formation of a top polysilicon plate, and a polysilicon gate structure; and the use of a selectively grown epitaxial silicon, for the channel region of the transfer gate transistor.

SUMMARY OF THE INVENTION

It is an object of this invention to form a transfer gate transistor, and a capacitor structure, on the same semiconductor substrate, featuring the simultaneous formation of the polysilicon gate structure, of the transfer gate transistor, and the polysilicon top plate, of the capacitor structure.

It is another object of this invention to use a CMP procedure, to form the polysilicon capacitor bottom plate, embedded in an insulator layer.

It is still another object of this invention to use a selective epitaxial growth, (SEG), procedure to form an active device silicon region, in an opening in a composite insulator layer, resulting in a planar top surface topography comprised of the embedded, polysilicon capacitor bottom plate, and the active device silicon region, allowing the subsequent formation of an overlying polysilicon gate structure, and an overlying polysilicon capacitor top plate, to be formed on the planar, underlying topography.

In accordance with the present invention a method of forming a transfer gate transistor, and a capacitor structure, on the same semiconductor chip, featuring the simultaneous formation of the polysilicon gate structure, of the transfer gate transistor, and the polysilicon top plate, of the capacitor structure, is described. A polysilicon bottom plate, of a subsequent capacitor structure, is embedded in a first opening in a portion of a composite insulator layer, via deposition of a polysilicon layer, followed by a CMP procedure. A selectively grown, epitaxial silicon layer is next formed in a second opening in the composite insulator layer, located in a subsequent transfer gate transistor region, resulting in a planar top surface topography comprised of the polysilicon bottom plate, of the capacitor structure, and the transfer gate transistor, epitaxial silicon region. After formation of well regions, as well as the formation of threshold adjust, and punch through regions, creating an active device region, in the epitaxial silicon region, a gate insulator layer is grown on the top surface of the epitaxial silicon region, while the same oxidation procedure forms the capacitor dielectric layer, on the polysilicon bottom plate. A polysilicon layer is deposited and patterned creating both a polysilicon gate structure, on the gate insulator layer, and a polysilicon top plate, on the capacitor dielectric layer. Source/drain regions, are then formed in regions of the active device region of the transfer gate transistor, not covered by the polysilicon gate structure, in addition to the formation of insulator spacers on the sides of the polysilicon gate structure and the polysilicon top plate.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

Figure 1:
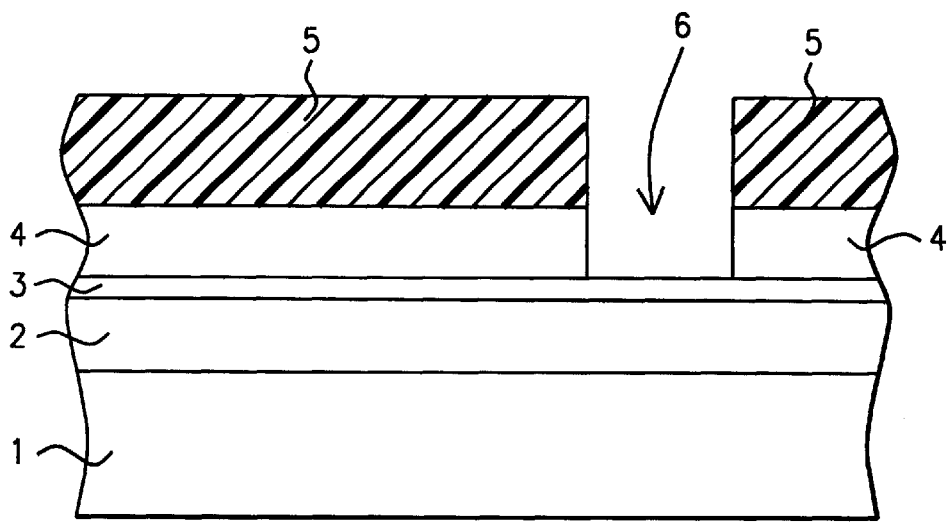
FIGS. 1–9, which schematically, in cross-sectional style, describe the key stages of fabrication, used to form a transfer gate transistor, and a capacitor structure, on the same semiconductor chip, featuring the formation of a polysilicon bottom plate, embedded in an insulator layer, allowing the simultaneous formation of a polysilicon gate structure, and a polysilicon capacitor top plate, to be achieved on a planar top surface.

The method of forming a planar top surface, comprised with an embedded, polysilicon bottom plate, of a capacitor structure, and a selectively grown epitaxial silicon layer, in a transfer gate transistor region, allowing the subsequent, simultaneous formation of a polysilicon gate structure, in the transfer gate transistor region, and of a polysilicon top plate, for the capacitor structure, will now be described in detail. A P type, semiconductor substrate 1, comprised of single crystalline silicon, with a <100> crystallographic orientation, is used and shown schematically in FIG. 1. A first silicon oxide layer 2, at a thickness between about 2000 to 4000 Angstroms, is next formed using either thermal oxidation procedures, low pressure chemical vapor deposition, (LPCVD), procedures, or plasma enhanced chemical vapor deposition, (PECVD), procedures. A first silicon nitride layer 3, is next deposited at a thickness between about 200 to 400 Angstroms, via LPCVD or PECVD procedures, followed by the deposition of second silicon oxide layer 4, to a thickness between about 2000 to 4000 Angstroms, again via LPCVD or PECVD procedures. Photoresist shape 5, is used as a mask to allow an anisotropic, reactive ion etching procedure, using $CHF_3$ as an etchant for second silicon oxide layer 4, to form first opening 6, shown schematically in FIG. 1. Photoresist shape 5, is then removed using plasma oxygen ashing and careful wet cleans.

Figure 2:
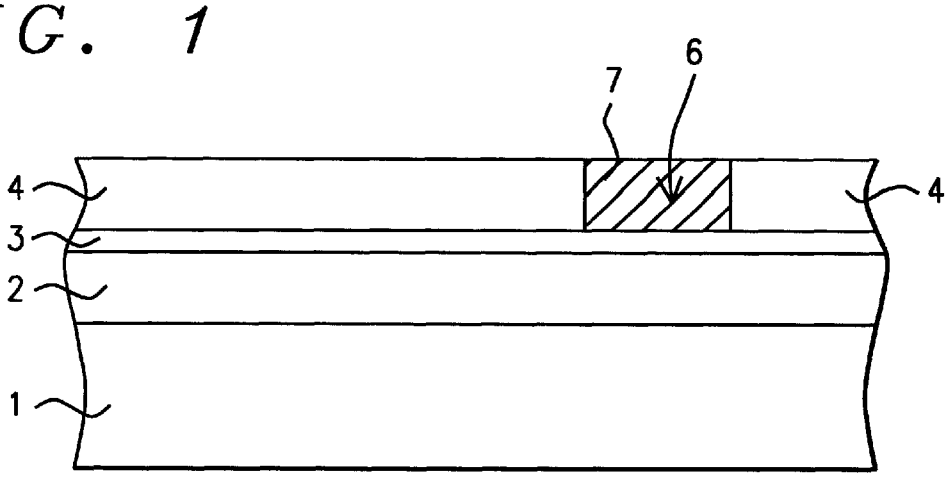
Figure 3:
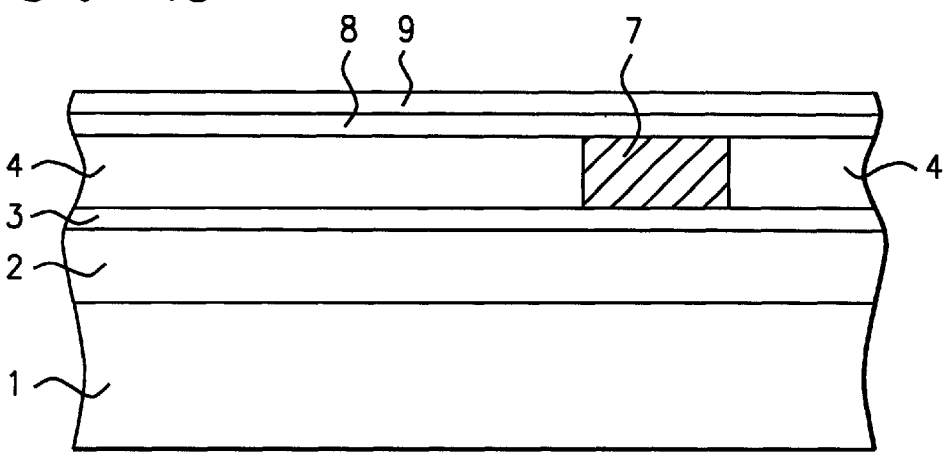

A polysilicon layer is next deposited, via LPCVD procedures, to a thickness between about 2000 to 4000 Angstroms, completely filling first opening 6. A chemical mechanical polishing, (CMP), procedure, is next used to remove regions of the polysilicon layer, from the top surface of second silicon oxide layer 4, resulting in polysilicon bottom plate 7, embedded in first opening 6. This is schematically shown in FIG. 2. Doping of polysilicon bottom plate 7, is next addressed via ion implantation of arsenic or phosphorous, at an energy between about 30 to 60 KeV, at a dose between about 3E15 to 6E15 atoms/$cm^2$, followed by an anneal procedure, performed in a nitrogen ambient, at a temperature between about 800 to 900° C., for a time between about 20 to 30 min, activating and distributing, the implanted ions. After a pre-clean, using a dilute HF, or a buffered HF solution, third silicon oxide layer 8, shown schematically in FIG. 3, is formed at a thickness between about 50 to 200 Angstroms, via LPCVD, or PECVD procedures, followed by the deposition of second silicon nitride layer 9, at a thickness between about 100 to 300 Angstroms, via LPCVD or PECVD procedures.

Figure 4:
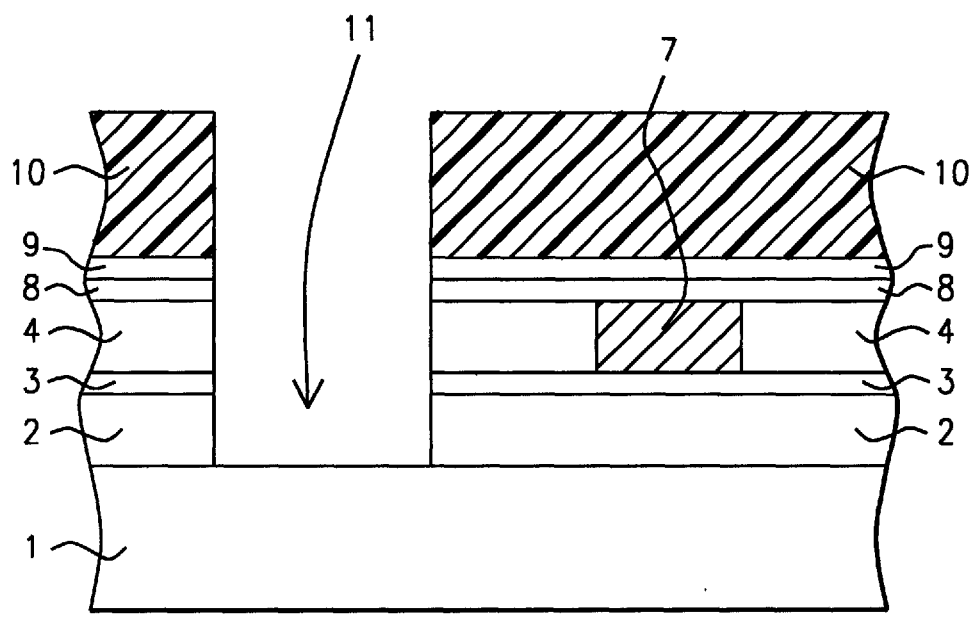
Figure 5:
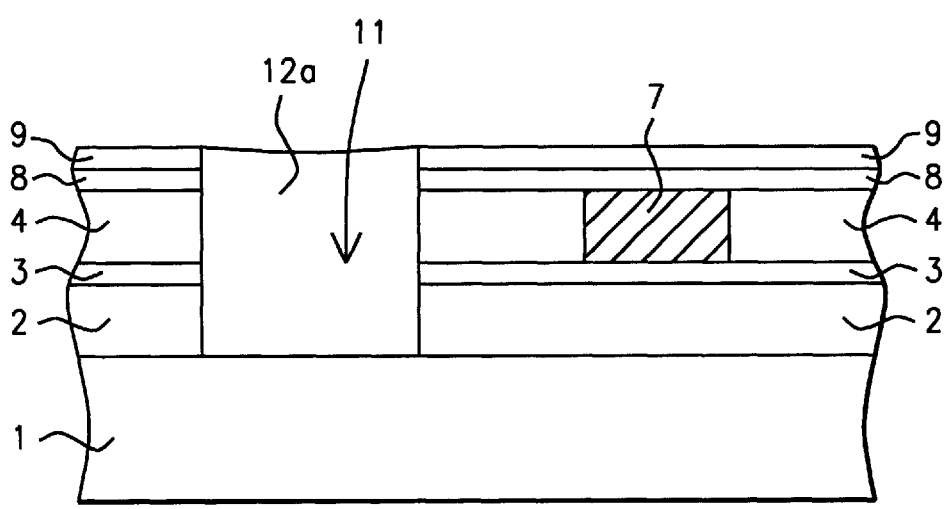

The process sequence used to form the active device region, for a transfer gate transistor, featuring planarity with the top surface of polysilicon bottom plate 7, is next addressed. Photoresist shape 10, is used as a mask to allow second opening, or active device opening 11, to be formed via an anisotropic RIE procedure, using $CF_4$ as an etchant for second silicon nitride layer 9, and for first silicon nitride layer 3, while $CHF_3$ is used as an etchant for third silicon oxide layer 8, second silicon oxide layer 4, and for first silicon oxide layer 2. This is schematically shown in FIG. 4 After removal of photoresist shape 10, via plasma oxygen ashing and careful wet cleans, a selectively grown epitaxial layer 12a, is used to completely fill active device opening 11, with the growth of selectively grown epitaxial silicon layer 12a, formed to a level equal to the top of active device opening 11, resulting in planarity with polysilicon bottom plate 7. This is schematically shown in FIG. 5. Selectively grown epitaxial layer, or active device region 12a, is formed at a thickness between about 4000 to 8000 Angstroms, at a deposition temperature between about 600 to 1100° C., using silane, ($SiH_4$), and hydrogen, or dichlorosilane, ($SiH_2Cl_2$), and HCl as a source.

Figure 6:
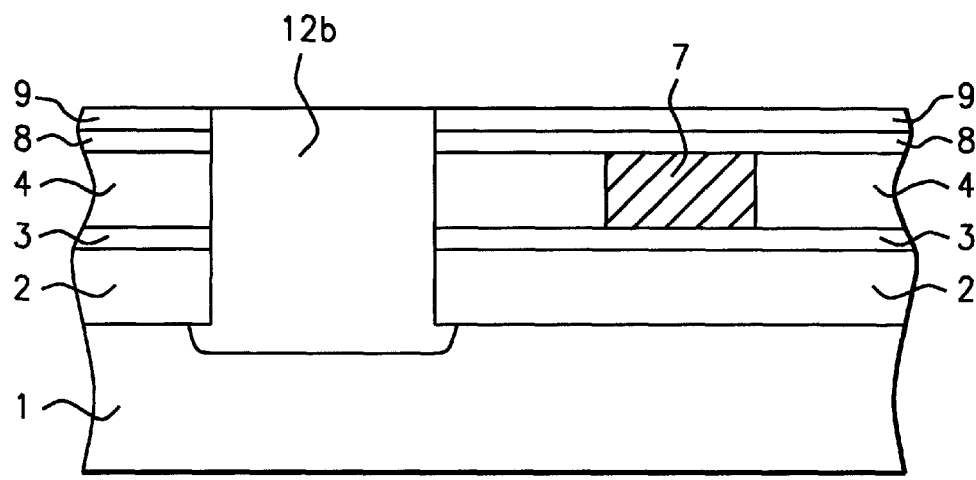

At this point of the process formation of P well regions, for subsequent N channel, metal oxide semiconductor field effect transistors, (NFET), and N well regions, for subsequent P channel, metal oxide semiconductor field effect transistors, (PFET), are formed in active device regions 12a. For this description, NFET fabrication will only be described, however photoresist block shapes, and ion implantation procedures, can be used to form both NFET and PFET structures. A silicon oxide layer, (not shown in the drawings), is formed on exposed regions of active device region 12a, followed by the formation of a photoresist block out shape, (not shown in the drawings), exposing active device region 12a, to an ion implantation procedure, using boron or $BF_2$ ions, creating P well region 12b. This is schematically shown in FIG. 6. With the photoresist block out shape still in place, a threshold adjust ion implantation region, formed using $BF_2$ ions, and a punch through ion implantation region, formed using boron ions, (both not shown in the drawings), are formed in P well region 12b. As stated previously, similar photoresist block shapes can be employed to expose only N well regions, to create the threshold adjust, and punch through regions, for PFET devices. The photoresist shape used for block out, is then removed via plasma oxygen ashing and careful wet cleans.

Figure 7:
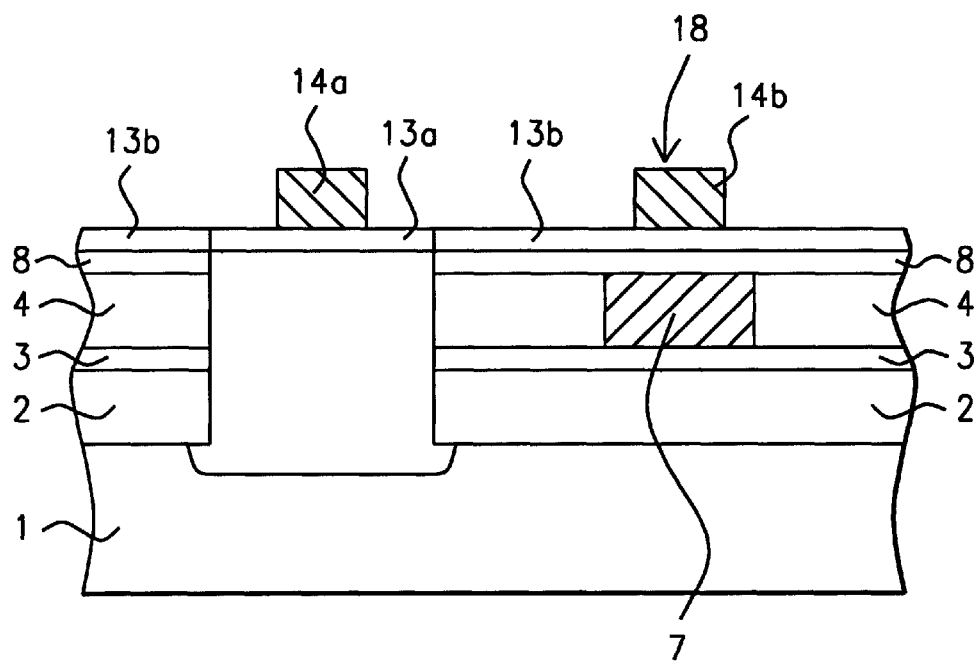

After a series of pre-clean procedures, featuring a buffered HF, or a dilute HF procedure, resulting in the removal of the silicon oxide layer, used as a screen oxide for the well, threshold adjust, and punch through ion implantation procedures, a silicon dioxide, gate insulator layer 13a, is formed on the top surface of active device region 12b. Silicon oxide layer 13a, at a thickness between about 30 to 50 Angstroms, is formed via a thermal oxidation procedure, in an oxygen-steam ambient, at a temperature between about 800 to 1000° C. This procedure also results in the oxidation of silicon nitride layer 9, resulting in the formation of silicon oxynitride layer 13b. This is schematically shown in FIG. 7. The formation of a polysilicon gate structure, and a polysilicon top plate is next addressed. A polysilicon layer is first deposited, via LPCVD procedures, to a thickness between about 2000 to 2500 Angstroms. The polysilicon layer is either doped in situ, during deposition, via the addition of arsine or phosphine, to a silane ambient, or the polysilicon layer is deposited intrinsically, then doped via ion implantation of either arsenic, or phosphorous ions. A photoresist shape is then used as a mask, allowing a selective, anisotropic RIE procedure, using $Cl_2$ or $SF_6$ as an etchant, to create polysilicon gate structure 14a, and polysilicon top plate 14b. The capacitor structure 18, is now comprised of polysilicon top plate 14b, the composite dielectric layer of silicon oxynitride layer 13b—silicon oxide layer 8, and of polysilicon bottom plate 7. The ability to create a planar top surface topography, alleviated the risk of residual polysilicon, located between these polysilicon structures, thus reducing the risk of leakage or shorts between the polysilicon structures. The resulting polysilicon structures are schematically shown in FIG. 7. The photoresist shape, used for definition of polysilicon gate structure 14a, and of polysilicon top plate 14b, is removed using plasma oxygen ashing and careful wet cleans.

Figure 8:
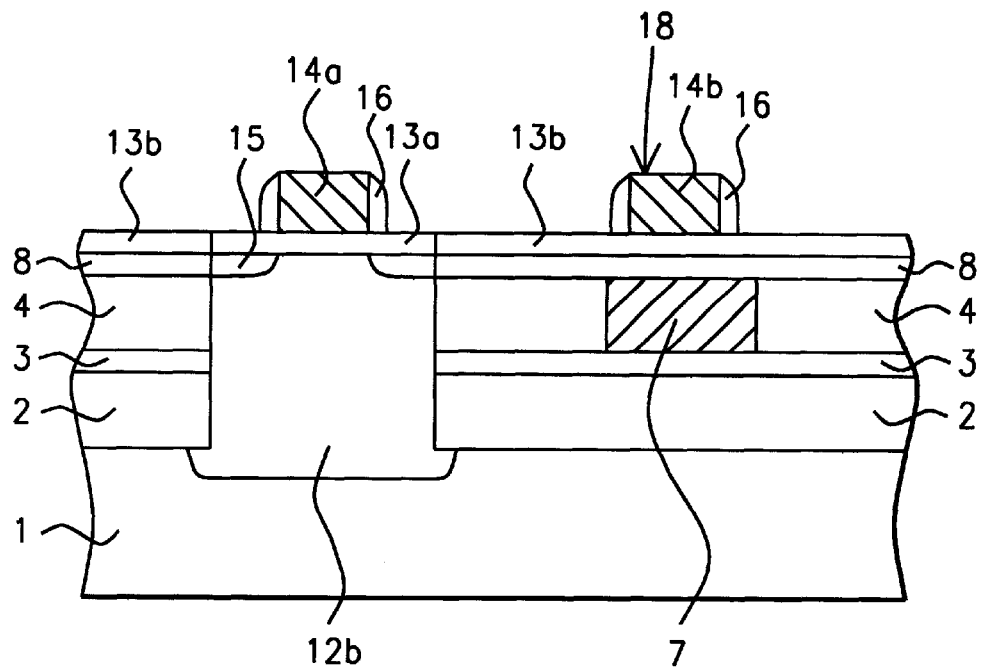
Figure 9:
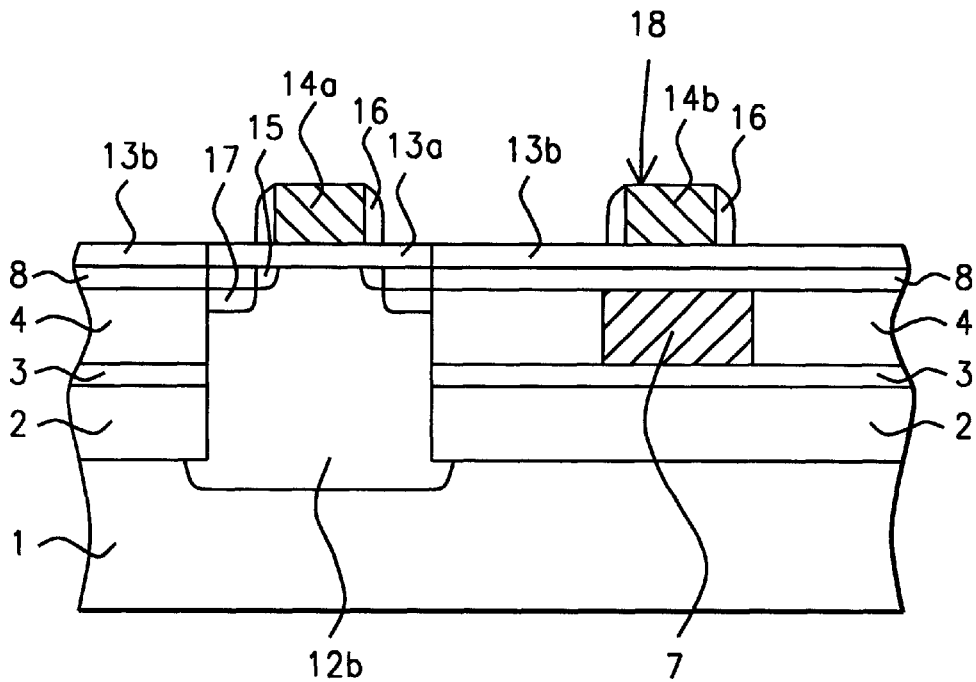

The completion of the transfer gate transistor is next addressed and shown schematically in FIGS. 8–9. First, lightly doped source/drain region 15, is formed in an area of active device region 12b, not covered by polysilicon gate structure 14a, via ion implantation of arsenic or phosphorous ions, at an energy between about 10 to 30 KeV, and at a dose between about 5E13 to 5E14 atoms/$cm^2$. An insulator layer, comprised of either silicon oxide, or silicon nitride, is next deposited, via LPCVD or PECVD procedures, at a thickness between about 1000 to 1500 Angstroms. An anisotropic RIE procedure, using $CF_4$ or $CHF_3$ as a n etchant, is then employed to form insulator spacers 16, on the sides of polysilicon gate structure 14a, and on the sides of polysilicon top plate 14b. Another ion implantation procedure is then performed, again using arsenic or phosphorous ions, at an energy between about 30 to 50 KeV, at a dose between about 2E15 to 5E15 atoms/cm², creating heavily doped source/drain region 17, in an area of active device region 12b, not covered by polysilicon gate structure 14a, or by insulator spacers 16. Again if complimentary metal oxide semiconductor, (CMOS), devices are desired, the creation of the N type source/drain regions, just described, would have been created using a photoresist block out shape, protecting the PFET devices from these implantation procedures. This would be followed by a photoresist block out shape, used to protect the NFET devices, from P type, source/drain ion implantation procedures.

While this invention has been particularly shown and described with reference to the preferred embodiments thereof, it will be understood by those skilled in the art that various changes in form and details may be made without departing from the spirit and scope of this invention.

What is claimed is:

1. A method of simultaneously forming a capacitor structure, and a transfer gate transistor, on a semiconductor substrate, comprising the steps of:

forming a first opening, in a portion of a composite insulator layer, in a first region of said semiconductor substrate, to be used for said capacitor structure;

forming a capacitor bottom plate structure, in said first opening;

forming a second opening in said composite insulator layer, in a second region of said semiconductor substrate, to be used for said transfer gate transistor;

selectively growing an epitaxial silicon layer, to form an active device region, in said second opening, with the top surface of said active device region, planar with the top surface of said capacitor bottom plate structure;

forming a well region, in said active device region;

performing a thermal oxidation procedure to form a gate insulator layer, on the top surface of said active device region, and to form a capacitor dielectric layer, on the top surface of said capacitor bottom plate structure;

deposition of, and patterning of, a polysilicon layer, to simultaneously create a polysilicon gate structure, on said gate insulator layer, and a capacitor top plate structure, on said capacitor dielectric layer;

forming a lightly doped source/drain region, in an area of said active device region not covered by said polysilicon gate structure;

forming insulator spacers on the sides of said polysilicon gate structure, and on the sides of said capacitor top plate structure; and forming a heavily doped source/drain region, in an area of said active device region not covered by said polysilicon gate structure, or by said insulator spacers.

2. The method of claim 1, wherein said composite insulator layer is comprised of an underlying, first silicon oxide layer, obtained using either thermal oxidation, low pressure chemical vapor deposition, (LPCVD), or plasma enhanced chemical vapor deposition, (PECVD), procedures, to a thickness between about 2000 to 4000 Angstroms; a first silicon nitride layer, obtained via LPCVD or PECVD procedures, to a thickness between about 200 to 400 Angstroms; a second silicon oxide layer, obtained via LPCVD or PECVD procedures, to a thickness between about 2000 to 4000 Angstroms; a third silicon oxide layer, obtained via LPCVD or PECVD procedures, at a thickness between about 50 to 200 Angstroms; and an overlying second silicon nitride layer, obtained via LPCVD or PECVD procedures, at a thickness between about 100 to 300 Angstroms.

3. The method of claim 1, wherein said first opening is formed in the portion of said composite insulator layer, comprised of second silicon oxide layer, via an anisotropic RIE procedure, using $CHF_3$ as an etchant for said second silicon oxide layer.

4. The method of claim 1, wherein said capacitor bottom plate structure, is a polysilicon bottom plate, formed via deposition of a polysilicon layer, via LPCVD procedures, to a thickness between about 2000 to 4000 Angstroms, followed by a chemical mechanical polishing procedure, resulting in said capacitor bottom plate structure, embedded in said first opening.

5. The method of claim 1, wherein said capacitor bottom plate is doped via ion implantation of arsenic, or phosphorous ions, at an energy between about 30 to 60 KeV, at a dose between about 3E15 to 6E15 atoms/cm², followed by an anneal procedure, performed at a temperature between about 800 to 900° C., for a time between about 20 to 30 min, in a nitrogen ambient.

6. The method of claim 1, wherein said second opening is formed in said composite insulator layer via an anisotropic RIE procedure, using $CF_4$ as an etchant for the second silicon nitride layer, and for the first silicon nitride layer, while using $CHF_3$ as an etchant for the third silicon oxide layer, for the second silicon oxide layer, and for the first silicon oxide layer.

7. The method of claim 1, wherein said epitaxial silicon layer is selectively grown, in said second opening, to a thickness between about 4000 to 8000 Angstroms, at a temperature between about 600 to 1100° C., using silane and hydrogen, or using dichlorosilane and HCl as a source.

8. The method of claim 1, wherein said well region, in said active device region, is a P well region, formed via ion implantation of boron, or $BF_2$ ions.

9. The method of claim 1, wherein said gate insulator layer, is a silicon dioxide layer, at a thickness between about 30 to 50 Angstroms, formed on the top surface of said active device region via a thermal oxidation procedure, performed at a temperature between about 800 to 1000° C.

10. The method of claim 1, wherein said capacitor dielectric layer is a composite insulator layer, comprised of an overlying silicon oxynitride layer, formed via a thermal oxidation of the second silicon nitride layer, and comprised of the underlying third silicon oxide layer.

11. The method of claim 1, wherein said polysilicon gate structure, and said capacitor top plate structure, are simultaneously formed from a polysilicon layer, obtained via LPCVD procedures, to a thickness between about 2000 to 2500 Angstroms, followed by an anisotropic RIE procedure, performed using $Cl_2$ or $SF_6$ as an etchant, and where the polysilicon layer is doped in situ, during deposition, via the addition of arsine, or phosphine, to a silane ambient, or where the polysilicon layer is deposited intrinsically, then doped via implantation of either arsenic or phosphorous ions.

12. A method of simultaneously forming a polysilicon gate structure, and a polysilicon capacitor top plate structure, on an underlying planar top surface of a semiconductor substrate, resulting from a selectively grown, epitaxial silicon region, in a second opening in a composite insulator layer, located underlying said polysilicon gate structure, and resulting from a polysilicon capacitor bottom plate structure, embedded in a first opening in a silicon oxide component of said composite insulator layer, comprising the steps of:

forming a first silicon oxide layer, on said semiconductor substrate;

depositing a first silicon nitride layer;

depositing a second silicon oxide layer;

forming said first opening in said second silicon oxide layer;

forming said polysilicon capacitor bottom plate structure, in said first opening;

depositing a third silicon oxide layer;

depositing a second silicon nitride layer;

forming said second opening in said composite insulator layer comprised of said second silicon nitride layer, said third silicon oxide layer, said second silicon oxide layer, said first silicon nitride layer, and said first silicon oxide layer;

selectively growing said epitaxial silicon region, in said second opening, with the top surface of said epitaxial silicon region, planar with the top surface of said polysilicon capacitor bottom plate structure;

forming an active device region in said epitaxial silicon region, via creation of a P well region, a threshold voltage adjust region, and a punch through region, in said epitaxial silicon region;

performing a thermal oxidation procedure to grow a silicon dioxide gate layer, on the top surface of said active device region, and to convert a portion of said second silicon nitride layer, to a silicon oxynitride layer, resulting in a capacitor dielectric layer, comprised of oxidized silicon nitride, on said third silicon oxide layer, overlying said polysilicon capacitor bottom plate structure;

depositing a polysilicon layer;

patterning of said polysilicon layer to simultaneously form said polysilicon gate structure, on said silicon dioxide gate layer, and said polysilicon capacitor top plate structure, on the region of said capacitor dielectric layer overlying said polysilicon capacitor bottom plate structure;

forming a lightly doped source/drain region in an area of said active device region, not covered by said polysilicon gate structure;

forming insulator spacers on the sides of said polysilicon gate structure, and on the sides of said polysilicon capacitor top plate structure; and forming a heavily doped source/drain region in an area of said active device region, not covered by said polysilicon gate structure, or by said insulator spacers.

13. The method of claim 12, wherein said first silicon oxide layer is obtained at a thickness between about 2000 to 4000 Angstroms, via either a thermal oxidation, an LPCVD, or PECVD procedure.

14. The method of claim 12, wherein said first silicon nitride layer is obtained via LPCVD or PECVD procedures, at a thickness between about 200 to 400 Angstroms.

15. The method of claim 12, wherein said second silicon oxide layer is obtained via LPCVD or PECVD procedures, at a thickness between about 2000 to 4000 Angstroms.

16. The method of claim 12, wherein said first opening is formed, in said second silicon oxide layer, via an anisotropic RIE procedure, using $CHF_3$ as an etchant.

17. The method of claim 12, wherein said polysilicon capacitor bottom plate structure is comprised of polysilicon, obtained via LPCVD procedures, to a thickness between about 2000 to 4000 Angstroms, and doped via ion implantation of arsenic, or phosphorous ions, at an energy between about 30 to 60 KeV, and at a dose between about 3E15 to 6E15 atoms/$cm^2$, followed by an anneal procedure, performed at a temperature between about 800 to 900° C., in a nitrogen ambient, for a time between about 20 to 30 min.

18. The method of claim 12, wherein a CMP procedure is used to form said polysilicon capacitor bottom plate structure, embedded in said second silicon oxide layer.

19. The method of claim 12, wherein said second opening, in said composite insulator layer, is formed via an anisotropic RIE procedure, using $CHF_3$ as an etchant for said third silicon oxide layer, for said second silicon oxide layer, and for said first silicon oxide layer, and using $CF_4$ as an etchant for said second silicon nitride layer, and for said first silicon nitride layer.

20. The method of claim 12, wherein said epitaxial silicon region, is formed in said second opening, to a thickness between about 4000 to 8000 Angstroms, via a selective epitaxial silicon growth procedure, performed at a temperature between about 600 to 1100° C., using silane and hydrogen, or using dichlorosilane and HCl as a source.

21. The method of claim 12, wherein said P well region is formed, in said epitaxial silicon region, via ion implantation of boron or $BF_2$ ions.

22. The method of claim 12, wherein said silicon dioxide gate layer is formed at a thickness between about 30 to 50 Angstroms, via a thermal oxidation procedure, performed at a temperature between about 800 to 1000° C.

23. The method of claim 12, wherein said polysilicon layer is obtained via LPCVD procedures, to a thickness between about 2000 to 25 Angstroms, and either in situ, during deposition, via the addition of arsine, or phosphorous, to a silane ambient, or said polysilicon layer is deposited intrinsically, then doped via ion implantation of arsenic or phosphorous ions.

24. The method of claim 12, wherein said polysilicon gate structure, and said polysilicon capacitor top plate structure, are simultaneously formed using an anisotropic RIE procedure, applied to said polysilicon layer, using $Cl_2$ of $SF_6$ as an etchant.

* * * * *